(12) United States Patent
Seidel et al.

(10) Patent No.: US 7,741,208 B2
(45) Date of Patent: Jun. 22, 2010

(54) METHOD FOR MAKING A WEDGE WEDGE WIRE LOOP

(75) Inventors: Marit Seidel, Sattel (CH); Jan Mattmueller, Brussels (BE)

(73) Assignee: Oerlikon Assembly Equipment Ltd., Steinhausen (CH)

( * ) Notice: Subject to any disclaimer, the term of this patent is extended or adjusted under 35 U.S.C. 154(b) by 455 days.

(21) Appl. No.: 11/729,021

(22) Filed: Mar. 28, 2007

(65) Prior Publication Data

US 2007/0231959 A1    Oct. 4, 2007

(30) Foreign Application Priority Data

Mar. 30, 2006   (CH) ..................................... 0543/06

(51) Int. Cl.
*H01L 21/44*    (2006.01)
(52) U.S. Cl. ............ 438/617; 438/107; 438/118; 438/612; 257/E21.48; 257/E21.499; 257/E21.509
(58) Field of Classification Search ............ 257/E21.48, 257/E21.481
See application file for complete search history.

(56) References Cited

U.S. PATENT DOCUMENTS

| | | | |
|---|---|---|---|
| 4,437,604 A | 3/1984 | Razon et al. | 228/179 |
| 5,111,989 A | 5/1992 | Holdgrafer et al. | 228/110 |
| 6,012,625 A | 1/2000 | Zakel et al. | 228/254 |
| 6,774,494 B2 | 8/2004 | Arakawa | 257/779 |
| 2003/0222338 A1 | 12/2003 | Wallace | 257/691 |
| 2004/0104477 A1 | 6/2004 | Fujisawa | 257/738 |
| 2004/0152292 A1 | 8/2004 | Babinetz et al. | 438/617 |
| 2005/0054186 A1 | 3/2005 | Kim et al. | 438/612 |
| 2005/0072833 A1 | 4/2005 | Wong et al. | 228/180.5 |
| 2005/0092815 A1 | 5/2005 | Mii | 228/180.5 |
| 2005/0167473 A1 | 8/2005 | Mayer et al. | 228/180.5 |
| 2005/0189567 A1 | 9/2005 | Fujisawa | 257/200 |

FOREIGN PATENT DOCUMENTS

| | | |
|---|---|---|
| JP | 03289149 | 12/1991 |
| JP | 2005-19778 | 1/2005 |
| WO | WO 02/082527 A1 | 10/2002 |

*Primary Examiner*—Charles D Garber
*Assistant Examiner*—Cheung Lee
(74) *Attorney, Agent, or Firm*—McCormick, Paulding & Huber LLP

(57) ABSTRACT

A wedge wedge wire loop is formed with the steps:
a) lowering the capillary onto the first connection point and applying a predefined bond force and ultrasound for producing a wedge connection on the first connection point,
b) raising the capillary by a predetermined distance $D_1$ in an essentially vertical direction,
c) moving the capillary laterally and downwards in order to bend the wire and press it against the wedge connection,
d) raising the capillary and moving the capillary in order to form a wire loop and to attach the wire to the second connection point, and
e) tearing off the wire.

4 Claims, 3 Drawing Sheets

METHOD FOR MAKING A WEDGE WEDGE WIRE LOOP

PRIORITY CLAIM

Applicant hereby claims foreign priority under 35 U.S.C §119 from Swiss Application No. 543/06 filed Mar. 30, 2006, the disclosure of which is herein incorporated by reference.

FIELD OF THE INVENTION

The invention concerns a method for making a wedge wedge wire loop.

BACKGROUND OF THE INVENTION

Wire loops serve to produce electrical connections between a semiconductor chip and a substrate. Depending on the application, different demands are placed on the wire loops. The wire loops are mainly produced by a so-called Ball-Wire Bonder. The Ball-Wire Bonder has a capillary with a longitudinal drill hole that opens out into a ring-shaped working surface. The capillary is clamped to the tip of a horn. The wire runs through the longitudinal drill hole of the capillary. The capillary serves to attach the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. The ball is then attached to the connection point on the semiconductor chip by means of pressure and ultrasound. In doing so, ultrasound from an ultrasonic transducer is applied to the horn. This process is called ball bonding. The wire is then pulled through to the required length, formed into a wire loop and thermocompression bonded to the connection point on the substrate. This last sub-process is called wedge bonding. After attaching the wire to the connection point on the substrate, the wire is torn off and the next bond cycle can begin.

Figure 1:
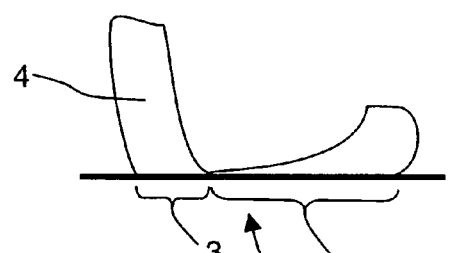

From the U.S. Pat. No. 4,437,604, a method is known with which the wire loops are attached to both connection points by means of a wedge connection. This means that the formation of the wire ball is omitted and that both wire connections are produced by compressing the piece of wire under the capillary, i.e. the working surface of the capillary presses the wire against the connection point. Compressing the wire is done by applying a predefined force and ultrasound, generally with increased temperature. Because the wedge connections are produced with a Ball Wire Bonder with which the capillary presses the wire onto the respective connection point and not with a Wedge Wire Bonder with which a wedge bond tool serves to attach and guide the wire, the quality of the wedge connection on the first connection point generally does not fulfil the set requirements. FIG. 1 shows the first wedge connection produced on the first connection point 1. The wedge connection comprises a so-called wedge bond 2 and a so-called tail bond 3. In order to achieve good adhesion of the wedge bond on the first connection point, during bonding the wire 4 has to be pressed against the first connection point with a lot of energy, i.e. with a relatively high bond force and under the application of ultrasound. The junction between the wedge bond and the tail bond is therefore very thin or is even completely severed so that the wire is practically only connected to the connection point by the tail bond. Adhesion of the tail bond is naturally much weaker than the adhesion of the wedge bond as because of the geometry of the capillary on the one hand the connection area is very small and, on the other hand, the pressing force of the capillary and the effect of ultrasound here are very low. With the subsequent formation of the wire loop, considerable forces are exerted on the tail bond that lead to weakening of the tail bond and therefore to all the problems that are known in the trade as "wire sway", "neck tilt", "loop height" and "loop shape" variations or even lead to the tail bond being torn away from the surface. In principle therefore this method enables the production of a wedge-wedge connection using a Ball Wire Bonder. However, for the named reasons, the stability of the first contact and therefore of the wire loop is totally insufficient because of the naturally weaker tail bond. For this reason, the wedge-wedge method fell into oblivion and was only taken up again in recent years.

A method for producing a bump-wedge wedge wire loop between a semiconductor chip and a substrate is known from patent application US 2005-0054186. With this method, a bump is first applied to the connection point on the semiconductor chip and then the wire loop is produced in that the end of the wire protruding out of the capillary is attached to the bump as a wedge connection, the wire is pulled out to the required length and attached to the second connection point on the substrate as a wedge connection.

A method for producing a ball bump-wedge wire loop between a semiconductor chip and a substrate is known from patent application US 2004-0152292. With this method, a so-called bump is first applied to the connection point on the semiconductor chip and then the wire loop is produced in that the wire protruding out of the capillary is melted into a ball and attached to the substrate as a ball connection, the wire is pulled out to the required length and attached to the bump on the semiconductor chip as a wedge connection. This method is known as "Reverse Bonding". It is not a wedge wedge method.

The two last mentioned methods enable the wire to be guided away practically parallel to the surface of the semiconductor chip. However "Reverse Bonding" has the disadvantage that a wire ball has to be formed for both wire connections which results in a comparatively long cycle time for the production of the wire loop. The other method has the advantage that only one wire ball has to be formed but has the disadvantage that the wire loop can often not be formed in the required shape.

SUMMARY OF THE INVENTION

The object of the invention is to develop a method for making a wedge wedge wire loop with which the above-mentioned disadvantages are eliminated.

A wedge wedge wire loop is formed with the steps:
a) lowering the capillary onto the first connection point and applying a predefined bond force and ultrasound for producing a wedge connection on the first connection point,
b) raising the capillary by a predetermined distance $D_1$ in an essentially vertical direction,
c) moving the capillary laterally and downwards in order to bend the wire and press it against the wedge connection,
d) raising the capillary and moving the capillary in order to form a wire loop and to attach the wire to the second connection point, and
e) tearing off the wire.

BRIEF DESCRIPTION OF THE DRAWING FIGURES

Figure 2:
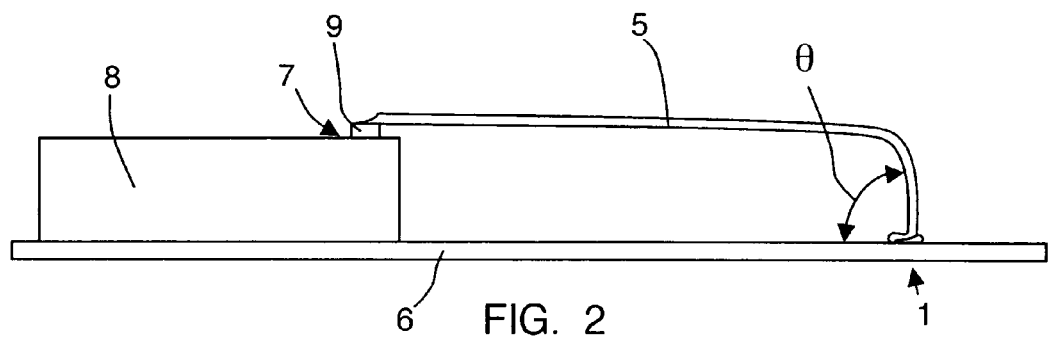
Figure 7:
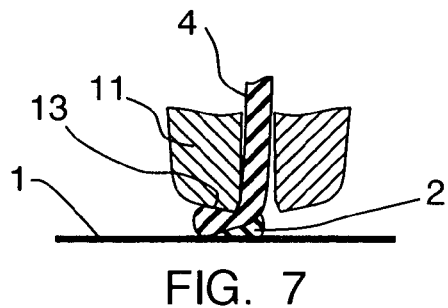
Figure 8:
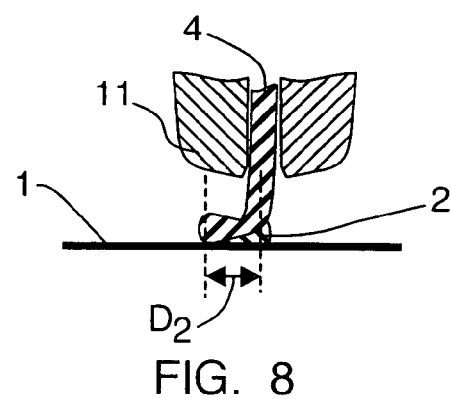
Figure 9:
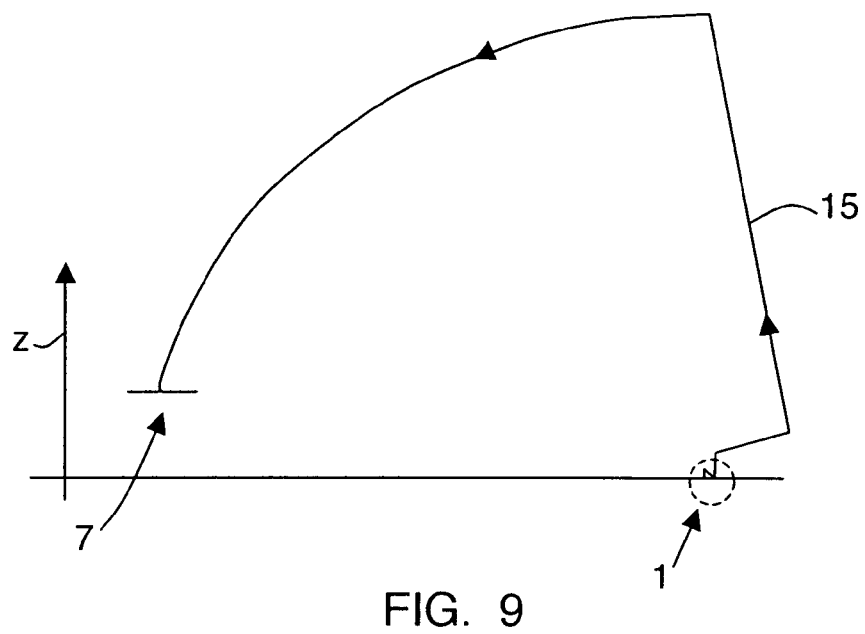
Figure 10:
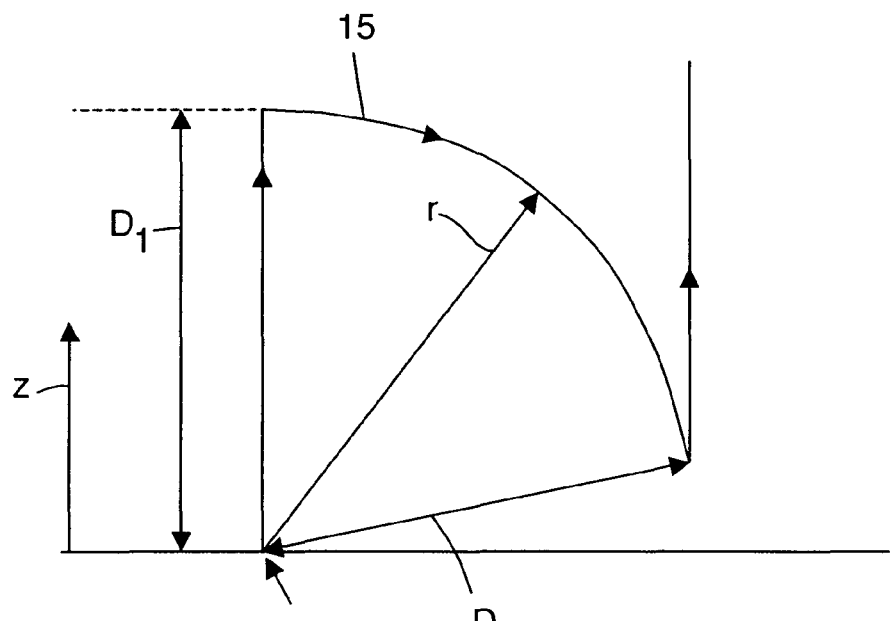
Figure 11:
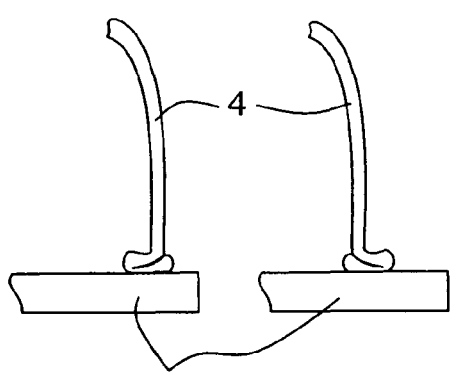
Figure 12:
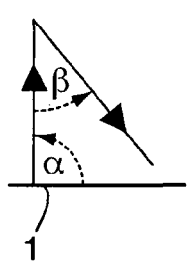
Figure 13:
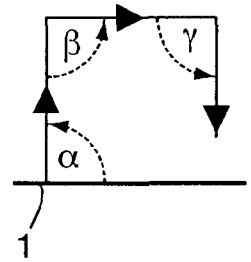
Figure 14:
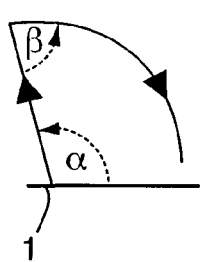

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 shows a wedge connection according to prior art,

FIG. 2 shows a wire loop produced in accordance with the invention with a first and a second wedge connection, FIGS. 3-8 show snapshots during production of the first wedge connection, FIG. 9 shows a possible trajectory path of the capillary, FIG. 10 shows a section from FIG. 9 with enlarged scale, FIG. 11 shows two wedge connections that only differ in their orientation, and FIGS. 12-14 show further possible trajectory paths of the capillary.

DETAILED DESCRIPTION OF THE PREFERRED EMBODIMENTS

FIG. 2 shows a wire loop 5 between a first connection point 1 on a substrate 6 and a second connection point 7 on a semiconductor chip 8 produced using the method in accordance with the invention. The semiconductor chip 8 is attached to the substrate 6. In the example, the second connection point 7 is located at a higher height than the first connection point 1. Before the wire loop 5 is produced, a so-called bump 9 is applied to the second connection point 7. The bump 9 can be created and applied to the second connection point 7 with the Ball Wire Bonder or by means of another known method. The substrate 6 can be any substrate known in the semiconductor industry. The substrate 6 can also be a second semiconductor chip as there are already many applications with which semiconductor chips are mounted directly one on top of the other as "stacked dies". On producing the wire loop 5, the end of the wire protruding out of the capillary of the Ball Wire Bonder is first attached to the first connection point 1 on the substrate 6 by means of a first wedge connection, the wire is pulled out to the required length whereby the wire loop is preformed and then, by means of a second wedge connection, the wire is attached to the bump 9 of the second connection point 7 or alternatively directly to the second connection point 7.

FIGS. 3 to 8 show snapshots taken during production of the first wedge connection. The method for making the wedge wedge wire loop in accordance with the invention, in particular production of the first wedge connection, is now explained in detail.

Figure 3:
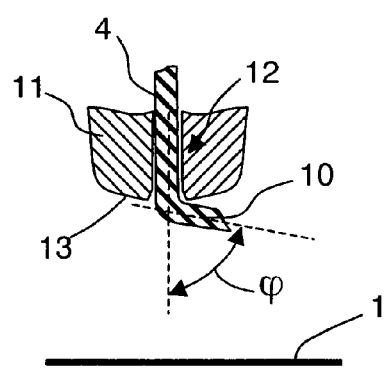
Figure 4:
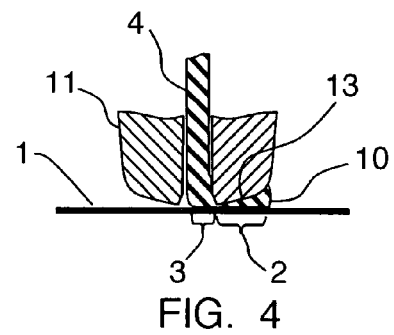

In order that the piece of wire protruding out of the capillary 11 can be attached to the first connection point 1 as a wedge connection, the piece of wire must not run in the longitudinal direction of the longitudinal drill hole 12 of the capillary 11 but has to embrace a predetermined minimum angle $\phi_0$ with the longitudinal direction so that the capillary 11 can press the wire 4 onto the first connection point 1 and produce a wedge connection with reproducible characteristics. In the following, it is assumed that the end 10 of the wire 4 protruding out of the capillary 11 together with the longitudinal drill hole 12 of the capillary 11 embraces an angle $\phi$ that is greater than the minimum angle $\phi_0$, and advantageously is oriented in the direction of the wire loop to be subsequently produced. FIG. 3 shows the capillary 11 with the longitudinal drill hole 12 and the end 10 of the wire 4 protruding out of the tip of the capillary 11. The wedge connection on the first connection point 1 is now produced with the following process steps:

1. Lowering the capillary 11 onto the first connection point 1 and securing the end 10 of the wire 4 protruding out of the capillary 11 to the first connection point 1 in that a predefined bond force and ultrasound are applied to the capillary 11. The end of the wire is now attached to the first connection point 1 as a wedge connection whereby the wedge connection comprises a wedge bond 2 and a tail bond 3. In doing so, the ring-shaped working area 13 of the capillary 11 presses onto the end 10 of the wire 4. FIG. 4 shows a snapshot taken after this process step.

Figure 5:
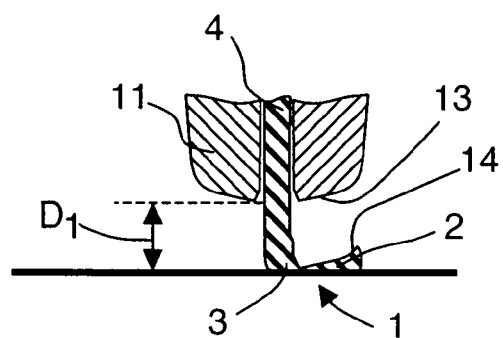

2. Raising the capillary 11 by a predetermined distance $D_1$ in an essentially vertical direction. When the capillary 11 moves in vertical direction then the friction between the wire 4 and the capillary 11 is at a minimum. Therefore, the force exerted on the tail bond 3 is also minimal. FIG. 5 shows a snapshot taken after this process step.

Figure 6:
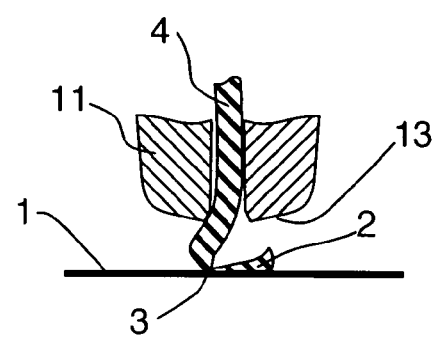

3. Moving the capillary 11 laterally and downwards in order to bend the wire 4 and press it onto the wedge connection. FIG. 6 shows a snapshot taken approximately in the middle of this process step. FIG. 7 shows a snapshot taken after this process step.

Step 3 serves to firmly anchor the wire 4 on the first wedge bond 2 so that the wire 4 does not tear off during the subsequent formation and completion of the wire loop 5.

As can be seen in FIG. 5, the capillary 11 leaves an imprint in the wedge bond 2 that is terminated with an edge 14. As can be seen in FIG. 8, during steps 1 to 3 the capillary 11 moves by the distance $D_2$ away from the original point of impact on the first connection point 1. Movement of the capillary 11 in step 2 occurs preferably along an essentially circular path with the radius $r=D_1$ centred on the original point of impact on the first connection point 1. The distance $D_2$ is therefore roughly equal to distance $D_1$. The distances $D_1$ and $D_2$ are preferably dimensioned so that the outlet of the longitudinal drill hole 12 of the capillary 11 comes to rest on the wedge bond 2 as is presented in FIG. 7.

The first connection between the wire 4 and the substrate 5 has now been produced. The wire loop 5 is now completed with the following steps:

4. Pulling the wire 4 out to the required length whereby the trajectory path followed by the capillary 11 runs as usually so that in doing so the wire loop 5 is preformed.

5. Moving the capillary 11 as far as the second connection point 7.

6. Attaching the wire to the bump 9 on the second connection point 7 or alternatively directly onto the second connection point 7.

7. After attachment and before tearing off the wire 4, the capillary 11 is raised slightly with the wire clamp open and then moved in a direction running horizontally or diagonally upwards and preferably in the direction of the next wire loop 5 to be produced, then the wire clamp is closed and the capillary 11 moved further until the wire 4 tears off. Together with the longitudinal direction, the wire 4 now encompasses an angle $\phi$ that is greater than the minimum angle $\phi_0$. Furthermore, the wire 4 is optimally aligned for producing the first wedge connection of the next wire connection 5.

The process steps 6 and 7 take place as described when no bumps are required or when all bumps are already present on the second connection points 7. If alternately a wedge wedge wire loop and then a bump have to be produced, the two additional process steps 6B and 6C have to be carried out after process step 6 and before process step 7:

6B. After attachment, the capillary 11 is raised slightly with the wire clamp open then the wire clamp is closed and the capillary 11 raised further until the wire 4 tears off.

6C. The piece of wire protruding out of the capillary 11 is melted into a ball and placed onto the second connection point as a bump.

With a first version of the method in accordance with the invention, in steps 3 and 4 the capillary 11 follows a predetermined trajectory path 15, whereby on transition from step 3 to step 4 the direction of its travelling motion is reversed. FIG. 9 shows the optimum trajectory path 15 of the capillary 11 for producing the wire loop 5 presented in FIG. 2. FIG. 10 shows an enlarged presentation of the section marked with a circle in FIG. 9 that concerns the production of the first wedge connection in accordance with the process steps 1 to 3 explained above.

Because the first wedge connection produced according to this method is firmly anchored on the substrate 6, in principle, its alignment is of no importance. Two such wedge connections with different alignment, namely their orientation rotated by 180°, are presented in FIG. 11.

For the bending of the wire, other trajectory paths are possible instead of the optimum trajectory path. Examples of this are presented in FIGS. 12 to 14. The trajectory paths are formed from straight or curved path sections that together or with the first connection point 1 embrace the angle α, β or γ. The angles α, β and γ can vary in wide areas. Advantageously, the trajectory path is rounded at the corners, i.e. at the transition from one path section to the next, so that the capillary 11 is able to follow the trajectory path as far as possible without stopping as each stop causes a loss in time. This is also valid for the trajectory path presented in FIG. 9.

With a second version of the method in accordance with the invention, a step 3B is carried out after step 3 and before step 4. In step 3B a predetermined bond force and optionally ultrasound are applied to the capillary 11 for a predetermined time duration in order to solder the bent piece of wire to the wedge connection underneath the working surface 13 of the capillary 11.

The essential advantages of the invention are:

Because the wire is firmly anchored to the first connection point 1, it can easily withstand the following load to which it is exposed on formation of the wire loop. The capillary can therefore follow any trajectory path that is optimally adapted to the shape of the wire loop to be achieved. On the other hand, the alignment of the wedge connection on the substrate can be adapted as required to the given requirements.

The cycle time is shorter than with prior art as one less wire ball is necessary, namely one instead of two or none instead of one.

With the method according to the first version, the wire is bent again during formation of the wire loop and pressed against the wedge connection that has just been produced whereby only a short stop is necessary for the change in direction. Because the dwell time of the capillary at the reversal point is very short and the bent piece of wire is not soldered to the wedge connection by means of ultrasound, an extremely short cycle time results.

With certain materials and processes the wedge contact presents a more reliable connection than the ball contact.

By means of the suggested wedge connection at the first connection point, the previous problems can be prevented.

The method in accordance with the invention is particularly suitable for the production of a wire loop as shown in FIG. 2. For applications such as "stacked dies" with at least two semiconductor chips mounted directly one on top of the other, the wire at the first connection point 1 has to rise very steeply, i.e. the angle θ often has to be greater than 75° so that the wire loops running at different levels do not come into contact with one another and nevertheless take up as little space as possible. However the invention is not limited to such wire loops. It can be used everywhere where the first connection of the wire loop to be made has to be a wedge connection.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method of making a wedge wedge wire loop between a first connection point and a second connection point with a capillary that has a longitudinal drill hole, an outlet of which opens out into a working surface, whereby the wire is guided through the longitudinal drill hole and whereby the capillary serves to attach the wire to the first connection point and to the second connection point as well as to guide the wire between the first connection point and the second connection point, the method comprising the steps:
    a) lowering the capillary onto the first connection point and producing a wedge connection on the first connection point by applying a predefined bond force and ultrasound,
    b) raising the capillary by a predetermined distance D1 in an essentially vertical direction,
    c) moving the capillary laterally and downwards in order to bend the wire and press the wire against the wedge connection,
    d) raising the capillary and moving the capillary in order to form a wire loop and to attach the wire to the second connection point, and
    e) tearing off the wire.

2. The method according to claim 1, wherein after step d the capillary is moved in a wire direction of a next wire loop to be produced in order to align the end of the wire protruding out of the capillary.

3. The method according to claim 1, wherein in step c, the movement of the capillary takes place along an essentially circular path section.

4. The method according to claim 2, wherein in step c, the movement of the capillary takes place along an essentially circular path section.

* * * * *